(12) United States Patent
Kim et al.

(10) Patent No.: US 10,818,610 B2
(45) Date of Patent: Oct. 27, 2020

(54) ADHESIVE FILM FOR SEMICONDUCTOR, AND SEMICONDUCTOR DEVICE

(71) Applicant: LG CHEM, LTD., Seoul (KR)

(72) Inventors: Hee Jung Kim, Daejeon (KR); Nu Ri Na, Daejeon (KR); Young Kook Kim, Daejeon (KR); Kwang Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

Patent file contains an affidavit/declaration under 37 CFR 1.130(b).

(21) Appl. No.: 16/313,258

(22) PCT Filed: Nov. 15, 2017

(86) PCT No.: PCT/KR2017/012953
§ 371 (c)(1),
(2) Date: Dec. 26, 2018

(87) PCT Pub. No.: WO2018/101651
PCT Pub. Date: Jun. 7, 2018

(65) Prior Publication Data
US 2019/0326226 A1    Oct. 24, 2019

(30) Foreign Application Priority Data
Nov. 29, 2016    (KR) .................. 10-2016-0160379

(51) Int. Cl.
*H01L 23/552* (2006.01)
*C09J 7/38* (2018.01)
(Continued)

(52) U.S. Cl.
CPC .............. *H01L 23/552* (2013.01); *C09J 7/28* (2018.01); *C09J 7/385* (2018.01); *C09J 9/02* (2013.01);
(Continued)

(58) Field of Classification Search
CPC ... H01L 23/552; H01L 25/0657; H01L 24/73; H01L 24/29; H01L 2924/3025;
(Continued)

(56) References Cited

U.S. PATENT DOCUMENTS 5,821,627 A * 10/1998 Mori ...................... H05K 3/328
257/780
6,541,137 B1 * 4/2003 Kingon .................. H05K 1/162
428/701
(Continued)

FOREIGN PATENT DOCUMENTS

JP    09-040919 A    2/1997
JP    2881136 B2    4/1999
(Continued)

OTHER PUBLICATIONS

International Search Report & Written Opinion issued for International Application No. PCT/KR2017/012953 dated Mar. 9, 2018, 12 pages.

*Primary Examiner* — Vu A Vu
(74) *Attorney, Agent, or Firm* — Rothwell, Figg, Ernst & Manbeck, P.C.

(57) ABSTRACT

There are provided an adhesive film for a semiconductor including: a conductive layer containing at least one metal selected from the group consisting of copper, nickel, cobalt, iron, stainless steel (SUS), and aluminum, and having a thickness of 0.05 μm or more; and an adhesive layer formed on at least one surface of the conductive layer and including a (meth)acrylate-based resin, a curing agent, and an epoxy
(Continued)

resin, and a semiconductor device including the above-mentioned adhesive film.

14 Claims, 2 Drawing Sheets

(51) Int. Cl.
- *C09J 7/28* (2018.01)
- *C09J 9/02* (2006.01)
- *H01L 23/00* (2006.01)
- *H01L 25/065* (2006.01)

(52) U.S. Cl.
CPC .............. *H01L 24/29* (2013.01); *H01L 24/73* (2013.01); *H01L 25/0657* (2013.01); *C09J 2203/326* (2013.01); *C09J 2400/163* (2013.01); *C09J 2433/00* (2013.01); *C09J 2463/00* (2013.01); *H01L 2224/2916* (2013.01); *H01L 2224/2917* (2013.01); *H01L 2224/2919* (2013.01); *H01L 2224/29083* (2013.01); *H01L 2224/29124* (2013.01); *H01L 2224/29147* (2013.01); *H01L 2224/29155* (2013.01); *H01L 2224/29157* (2013.01); *H01L 2224/29166* (2013.01); *H01L 2224/29172* (2013.01); *H01L 2224/29179* (2013.01); *H01L 2224/29181* (2013.01); *H01L 2224/73204* (2013.01); *H01L 2224/73265* (2013.01); *H01L 2225/0651* (2013.01); *H01L 2225/06506* (2013.01); *H01L 2225/06537* (2013.01); *H01L 2225/06562* (2013.01); *H01L 2225/06582* (2013.01); *H01L 2924/013* (2013.01); *H01L 2924/01006* (2013.01); *H01L 2924/01013* (2013.01); *H01L 2924/01014* (2013.01); *H01L 2924/01016* (2013.01); *H01L 2924/01022* (2013.01); *H01L 2924/01024* (2013.01); *H01L 2924/01025* (2013.01); *H01L 2924/01026* (2013.01); *H01L 2924/01027* (2013.01); *H01L 2924/01028* (2013.01); *H01L 2924/01029* (2013.01); *H01L 2924/01042* (2013.01); *H01L 2924/3025* (2013.01)

(58) Field of Classification Search
CPC ..... H01L 2924/013; H01L 2924/01042; H01L 2924/01029; H01L 2924/01028; H01L 2924/01027; H01L 2924/01026; H01L 2924/01025; H01L 2924/01024; H01L 2924/01022; H01L 2924/01016; H01L 2924/01014; H01L 2924/01013; H01L 2924/01006; H01L 2225/06582; H01L 2225/06562; H01L 2225/06537; H01L 2225/0651; H01L 2225/06506; H01L 2224/73265; H01L 2224/73204; H01L 2224/2919; H01L 2224/29181; H01L 2224/29179; H01L 2224/29172; H01L 2224/2917; H01L 2224/29166; H01L 2224/2916; H01L 2224/29157; H01L 2224/29155; H01L 2224/29147; H01L 2224/29124; H01L 2224/29083; H01L 23/522; H01L 23/31; H01L 23/00; C09J 9/02; C09J 7/28; C09J 7/385; C09J 2463/00; C09J 2433/00; C09J 2400/163; C09J 2203/326
USPC ........................................................ 257/659
See application file for complete search history.

(56) References Cited

U.S. PATENT DOCUMENTS

| | | | |
|---|---|---|---|
| 6,700,185 | B1 | 3/2004 | Kawai et al. |
| 7,057,266 | B2 | 6/2006 | Kawai et al. |
| 7,674,859 | B2 | 3/2010 | Saiki et al. |
| 9,343,696 | B2 | 5/2016 | Yoo et al. |
| 9,653,371 | B2* | 5/2017 | Moriyama ............. C08G 59/18 |
| 2009/0236745 | A1 | 6/2009 | Vrtis et al. |
| 2010/0178501 | A1 | 7/2010 | Masuko et al. |
| 2011/0006419 | A1* | 1/2011 | Hirano .................. C09J 7/0246 257/737 |
| 2011/0156279 | A1 | 6/2011 | Takamoto et al. |
| 2012/0126379 | A1 | 5/2012 | Uenda et al. |
| 2013/0041088 | A1 | 2/2013 | Park et al. |
| 2014/0069488 | A1 | 3/2014 | Tanaka et al. |
| 2015/0348877 | A1 | 12/2015 | Huang et al. |
| 2016/0336290 | A1* | 11/2016 | Kim ..................... C09J 133/14 |
| 2017/0198182 | A1 | 7/2017 | Kim et al. |
| 2017/0313914 | A1* | 11/2017 | Natori ..................... C09J 7/00 |
| 2018/0171184 | A1* | 6/2018 | Aoki ..................... C08L 81/02 |

FOREIGN PATENT DOCUMENTS

| | | |
|---|---|---|
| JP | 2011-253879 A | 12/2011 |
| JP | 2012-122058 A | 6/2012 |
| KR | 10-2002-0060143 A | 7/2002 |
| KR | 10-2011-0019398 A | 2/2011 |
| KR | 10-2011-0074469 A | 6/2011 |
| KR | 10-2012-0106623 A | 9/2012 |
| KR | 10-2013-0017614 A | 2/2013 |
| KR | 10-2013-0088102 A | 8/2013 |
| KR | 10-2014-0042798 A | 4/2014 |
| KR | 10-1404370 B1 | 6/2014 |
| KR | 10-1492629 B1 | 2/2015 |
| KR | 10-1544587 B1 | 8/2015 |
| KR | 10-2015-0136983 A | 12/2015 |
| KR | 10-2016-0107210 A | 9/2016 |
| KR | 10-2016-0119561 A | 10/2016 |
| KR | 10-2016-0128936 A | 11/2016 |
| TW | 200738841 A | 10/2007 |

* cited by examiner

【FIG. 1】
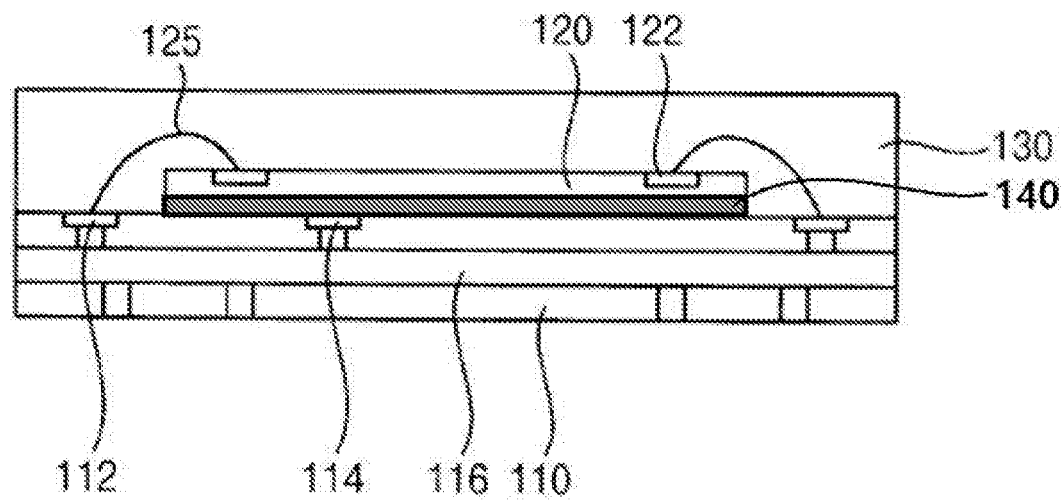
【FIG. 2】
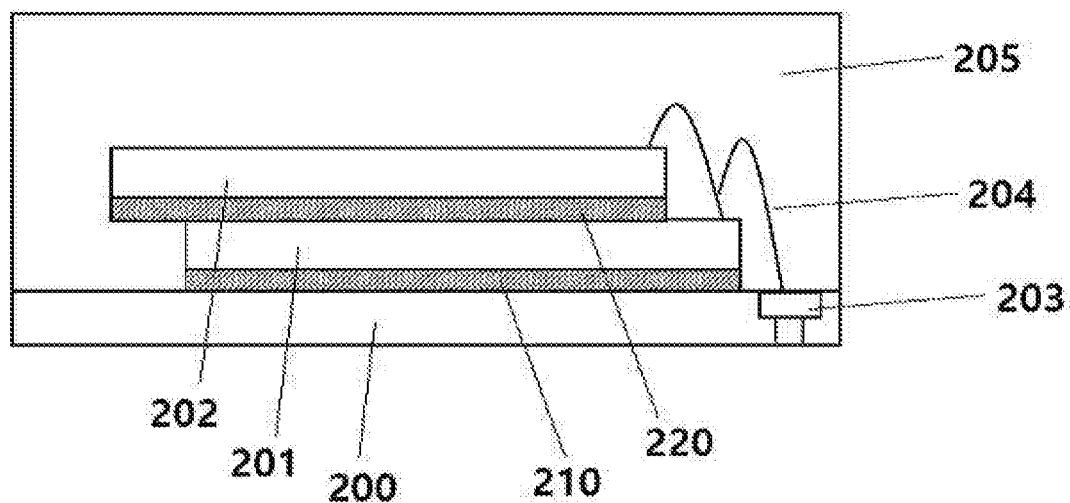

[FIG. 3]
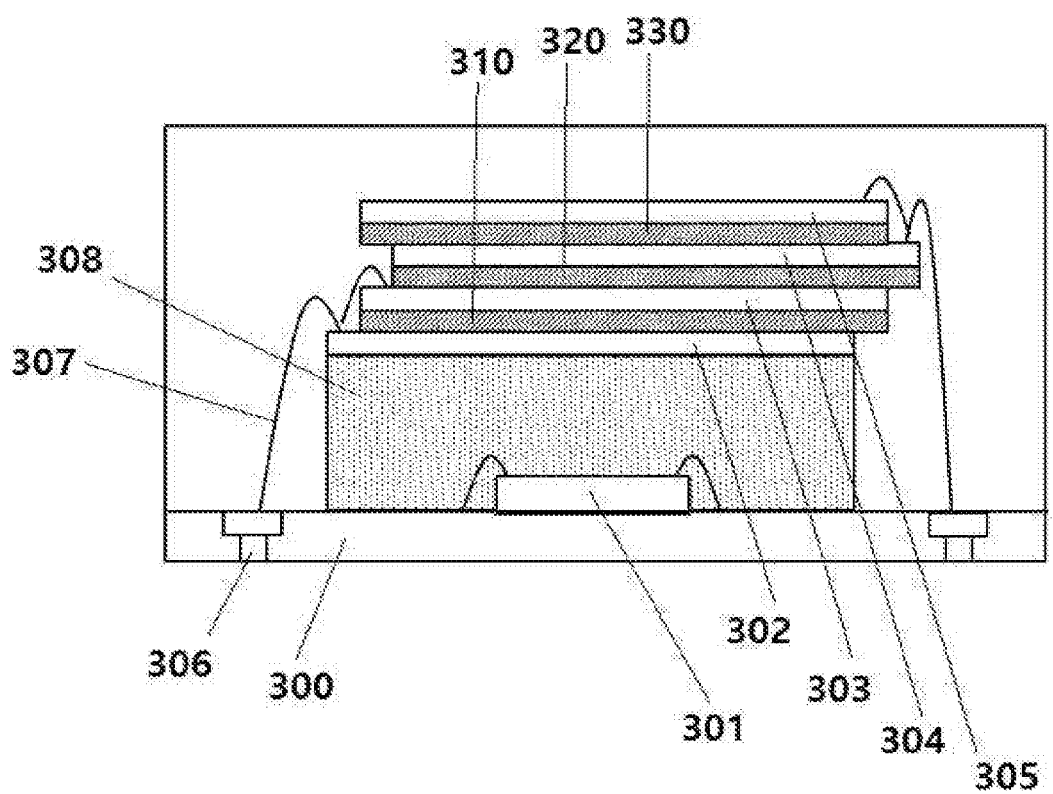

ADHESIVE FILM FOR SEMICONDUCTOR, AND SEMICONDUCTOR DEVICE

CROSS-REFERENCE TO RELATED APPLICATION

This application is a 35 U.S.C. § 371 National Phase Entry Application from PCT/KR2017/012953, filed on Nov. 15, 2017, and designating the United States, which claims priority to and the benefit of Korean Patent Application No. 10-2016-0160379 filed on Nov. 29, 2016 with the Korean Intellectual Property Office, the entire content of which is incorporated herein by reference.

TECHNICAL FIELD

Cross-Reference to Related Application

This application claims priority to and the benefit of Korean Patent Application No. 10-2016-0160379 filed on Nov. 29, 2016 with the Korean Intellectual Property Office, the entire content of which is incorporated herein by reference.

The present invention relates to an adhesive film for a semiconductor, and a semiconductor device.

BACKGROUND ART

Recently, with an increasing tendency of electronic devices toward miniaturization, high functionalization, and capacity enlargement, a demand for high density and highly integrated semiconductor packages has been rapidly increasing, and thus the size of semiconductor chips increasingly becomes large, and in terms of the improvement in the degree of integration, a stack packaging method of stacking chips in multi-stages is being increasingly used.

Depending on the use of the multi-stage semiconductor stack package, the thickness of the chip becomes thinner and the degree of integration of the circuit becomes higher. However, the modulus of the chip itself is lowered, causing problems in the manufacturing process and the reliability of the final product.

In order to solve these problems, attempts have been made to strengthen the physical properties of the adhesive used in the semiconductor packaging process.

In addition, recently, as a semiconductor chip has become thinner, there is a problem in that the chip is damaged in the existing blade cutting process thus lowering a yield, and in order to overcome this, a preparation process of firstly cutting a semiconductor chip with a blade and then polishing it has been suggested.

An adhesive is not cut in such preparation process. Thus, the adhesive is cut using a laser and then cut through an expanding process of the base film at a low temperature.

Further, recently, in order to protect the circuit on the chip, a process of cutting the adhesive through the low temperature expansion process and the heat shrinking process has been applied without using a laser.

However, conventional adhesives have low ductility and thus are not easily cut at room temperature, and also when allowed to stand at room temperature after being cut, re-adhesion occurs due to the low ductility, consequently lowering the production yield of semiconductor chips.

On the other hand, with a recent tendency of semiconductor packages toward higher density and higher integration, the generated amount of electromagnetic waves also increases. However, there are problems that such electromagnetic waves leak through a joint part or a connection part of electronic apparatus to cause harmful effects, such as inducing malfunction of other electrical elements or electronic components, or weakening the immune function of a human body.

Accordingly, various studies have been conducted on methods capable of realizing the characteristics that can effectively shield and absorb electromagnetic waves which cause malfunction of the electrical elements and adversely affect the human body, while improving the cutting property and the adhesiveness of the products used for semiconductor packaging.

DISCLOSURE

Technical Problem

It is one object of the present invention to provide an adhesive film for a semiconductor that can improve the reliability of a semiconductor chip due to improved physical properties of the cured product, and can be applied to various cutting methods without specific limitations to realize an excellent cutting property, thus improving reliability and efficiency of a semiconductor packaging process, and which can exhibit excellent electromagnetic wave absorption performance.

It is a further object of the present invention to provide a semiconductor device including the above-mentioned adhesive film for a semiconductor.

Technical Solution

In one embodiment of the present invention, there is provided an adhesive film for a semiconductor including: a conductive layer containing at least one metal selected from the group consisting of copper, nickel, cobalt, iron, stainless steel (SUS), and aluminum, and having a thickness of 0.05 µm or more; and an adhesive layer formed on at least one surface of the conductive layer and including a (meth)acrylate-based resin, a curing agent, and an epoxy resin.

In another embodiment of the present invention, there is provided a semiconductor device including the above-mentioned adhesive film for a semiconductor and a semiconductor element making contact with one surface of an adhesive layer of the adhesive film.

Hereinafter, the adhesive film for a semiconductor and the semiconductor element according to specific embodiments of the invention will be described in more detail.

As described above, according to an embodiment of the present invention, there may be provided an adhesive film for a semiconductor including: a conductive layer containing at least one metal selected from the group consisting of copper, nickel, cobalt, iron, stainless steel (SUS), and aluminum and having a thickness of 0.05 µm or more; and an adhesive layer formed on at least one surface of the conductive layer and including a (meth)acrylate-based resin, a curing agent, and an epoxy resin.

The present inventors conducted extensive studies on components that can be used for bonding or packaging of semiconductor elements, and found through numerous experiments that the adhesive film for a semiconductor having an adhesive layer of the above composition can improve the reliability of a semiconductor chip due to improved physical properties of the cured product, and can be applied to various cutting methods without specific limitations to realize an excellent cutting property, thus improving reliability and efficiency of a semiconductor packaging process, and additionally, the adhesive film for a semiconductor includes the conductive layer together, and thus secures excellent electromagnetic wave absorption performance. The present invention has been completed on the basis of such finding.

In particular, since the adhesive film for a semiconductor of the embodiment includes the specific metal(s) described above and a conductive layer having a thickness of greater than or equal to a predetermined numerical value, it can effectively shield and absorb electromagnetic waves that cause malfunction of the element in the semiconductor packaging process or the finally produced product or adversely affect the human body.

More specifically, the conductive layer containing at least one metal selected from the group consisting of copper, nickel, cobalt, iron, stainless steel (SUS), and aluminum must have a thickness of 0.05 µm or more so that the electromagnetic wave shielding effect can be substantially realized.

When the conductive layer has a thickness of less than 0.05 µm, the total intensity of electromagnetic waves that can be absorbed by the conductive layer is insignificant, and the resistance of the conductive layer may be greatly increased, thereby reducing the electromagnetic wave reflection efficiency.

The conductive layer can have a thickness of 0.05 µm or more, 0.05 µm to 10 µm, or 0.1 µm to 5 µm.

In addition, depending on the type of the metal contained in the conductive layer, the preferable range of the conductive layer may vary.

For example, the conductive layer may include a copper layer of 0.1 µm to 10 µm, a stainless steel (SUS) layer of 0.1 µm to 10 µm, an aluminum layer of 0.1 µm to 10 µm, a nickel layer of 0.05 µm to 10 µm, a cobalt layer of 0.05 µm to 10 µm, or an iron (Fe) layer of 0.05 µm to 10 µm.

Meanwhile, preferred examples of the conductive layer include a copper layer of 0.1 µm to 5 µm, a stainless steel (SUS) layer of 0.1 µm to 5 µm, an aluminum layer of 0.1 µm to 5 µm, a nickel layer of 0.05 µm to 2 µm, a cobalt layer of 0.05 µm to 2 µm, or an iron (Fe) layer of 0.05 µm to 2 µm.

The above-mentioned conductive layer may be formed by a method such as vapor deposition of the aforementioned metals on the adhesive layer or lamination of the aforementioned metal thin film.

Meanwhile, the adhesive film for a semiconductor of the embodiment may further include a barrier layer formed between the conductive layer and the adhesive layer and having a thickness of 0.001 µm to 1 µm.

The barrier layer may serve to prevent atoms or ions in the conductive layer from being diffused into the adhesive layer.

The barrier layer may have a thickness of 0.001 µm to 1 µm, or 0.005 µm to 0.5 µm.

As the barrier layer has the above thickness, it is possible to prevent the metal of the conductive layer from being ionized while preventing the atoms or ions of the conductive layer from being diffused into the adhesive layer, thereby further enhancing the reliability of the semiconductor package.

When the thickness of the barrier layer is too thin, it is difficult to prevent the ionization of the metal contained in the aforementioned conductive layer.

In addition, when the thickness of the barrier layer is too thick, the entire adhesive film for a semiconductor of the embodiment can become very thick. Consequently, it is difficult to be applied to a semiconductor package having a fine thickness, or the reliability of semiconductor packaging can be rather lowered, and the production costs can be increased unnecessarily.

Specifically, the barrier layer may include at least one selected from the group consisting of titanium (Ti), zirconium (Zr), hafnium (Hf), vanadium (V), niobium (Nb), tantalum (Ta), stainless steel, a nickel alloy, and a rare earth metal, or oxides thereof, and nitrides thereof.

Preferably, the barrier layer may include components other than stainless steel among the above-mentioned components, oxides thereof, or nitrides thereof.

The barrier layer includes a component different from that contained in the conductive layer. For example, when the conductive layer includes stainless steel, the barrier layer includes components other than stainless steel among the above-mentioned components.

As the barrier layer includes the above-mentioned transition metal, it is possible to prevent the metal of the conductive layer from being ionized while preventing the atoms or ions of the conductive layer from being diffused into the adhesive layer, thereby further increasing the reliability, as described above.

The nickel alloy means an alloy containing nickel and one or more elements selected from the group consisting of carbon, manganese, silicon, sulfur, iron, copper, chromium, aluminum, titanium, molybdenum, and cobalt. The specific kinds of alloys are the same as those in Table 1 below.

TABLE 1

| Alloy name | Ni | C | Mn | Si | S | Fe | Cu | Cr | Al | Ti | Mo | Co | Other components |
|---|---|---|---|---|---|---|---|---|---|---|---|---|---|
| NICKEL200 | 99.5 | 0.08 | 0.18 | 0.18 | 0.005 | 0.20 | 0.13 | — | — | — | — | — | — |
| NICKEL201 | 99.5 | 0.01 | 0.18 | 0.18 | 0.005 | 0.20 | 0.13 | — | — | — | — | — | — |
| MONEL400 | 66.5 | 0.15 | 1.00 | 0.25 | 0.012 | 1.25 | 31.5 | — | — | — | — | — | — |
| MONEL K500 | 66.5 | 0.13 | 0.75 | 0.25 | 0.005 | 1.00 | 29.5 | — | 2.73 | 0.60 | — | — | — |
| INCONEL 600 | 76.0 | 0.08 | 0.50 | 0.25 | 0.008 | 8.00 | 0.25 | 15.5 | — | — | — | — | — |
| INCOLOY 600 | 32.5 | 0.05 | 0.75 | 0.50 | 0.008 | 46.0 | 0.38 | 21.0 | 0.38 | 0.38 | — | — | — |
| INCOLOY 825 | 42.0 | 0.03 | 0.50 | 0.25 | 0.015 | 30.0 | 2.25 | 21.5 | 0.10 | 0.90 | 3.0 | — | — |
| HASTELLOY-B | 61.0 | 0.05 | 1.00 | 1.00 | 0.03 | 5.0 | — | 1.0 | — | — | 28.0 | 2.5 | — |
| HASTELLOY-C | 54.0 | 0.08 | 1.00 | 1.00 | 0.03 | 5.0 | — | 15.5 | — | — | 16.0 | 2.5 | 4.0 |
| HASTELLOY-W | 60.0 | 0.12 | 1.00 | 1.00 | 0.03 | 5.0 | — | 5.0 | — | — | 24.5 | 2.5 | — |

On the other hand, as described above, the adhesive film for a semiconductor can improve the reliability of a semiconductor chip due to improved physical properties of the cured product, and can be applied to various cutting methods without particular limitations to realize an excellent cutting property, thus improving reliability and efficiency of a semiconductor packaging process, and these effects appear to be caused by the above-mentioned adhesive layer.

Specifically, the adhesive layer may include a (meth)acrylate-based resin including a (meth)acrylate-based repeating unit containing an epoxy-based functional group, a curing agent including a phenol resin, and an epoxy resin.

As the (meth)acrylate-based resin includes a (meth)acrylate-based repeating unit containing an epoxy-based functional group, the adhesive layer have a more uniform and rigid internal structure, and thus high impact resistance, can be ensured during multistage stacking of an ultrathin wafer, and further, electrical properties after manufacture of a semiconductor may be improved.

The (meth)acrylate-based resin exhibits a hydroxyl equivalent weight of 0.15 eq/kg or less, or 0.10 eq/kg or less, and thus is more smoothly and uniformly cured with an epoxy, without inhibiting compatibility with other components of the resin composition, for example, an epoxy resin or a phenol resin. In particular, it enables a more uniform and rigid internal structure during curing of the resin composition, and exhibits an improved initial tensile modulus, thereby realizing a high cutting property even in the expanding process that is performed at a low temperature.

When the hydroxyl equivalent weight of the (meth)acrylate resin is high, for example, when it is more than 0.15 eq/kg, the compatibility with the epoxy resin, the phenol resin, or the like is lowered, and the uniformity of the appearance properties and mechanical properties of the adhesive film produced from the above resin composition may be deteriorated. In particular, when the adhesive film is initially elongated at room temperature, it is difficult to obtain a high modulus, and it may be difficult to ensure a sufficient cutting property in the expanding process at a low temperature.

The (meth)acrylate-based resin may have a glass transition temperature of −10° C. to 20° C., or −5° C. to 15° C.

By using the (meth)acrylate-based resin having the above-mentioned glass transition temperature, the adhesive layer may have sufficient flowability and the finally produced adhesive film may secure high adhesive strength, and it is easy to produce the adhesive film in the form of a thin film and the like using the adhesive layer.

Moreover, the (meth)acrylate-based resin may further include a (meth)acrylate-based repeating unit (BzMA) containing an aromatic functional group.

As described above, the adhesive layer may include a (meth)acrylate-based resin including a (meth)acrylate-based repeating unit containing an epoxy-based functional group and a (meth)acrylate-based repeating unit (BzMA) containing an aromatic functional group.

As the (meth)acrylate-based resin includes a (meth)acrylate-based repeating unit (BzMA) containing an aromatic functional group, the adhesive layer can secure higher compatibility and adhesive strength between the components contained therein, and have high elasticity. Further, it is possible to prevent a phenomenon in which the adhesive is softened due to heat generated when cutting the wafer, and a burr being generated in a part of the adhesive.

Further, the adhesive layer exhibits relatively improved initial tensile modulus, thereby realizing a high cutting property even in the expanding process that is performed at a low temperature.

The content of the (meth)acrylate-based functional group containing an aromatic functional group in the (meth)acrylate-based resin may be 2 to 40% by weight, 3 to 30% by weight, or 5 to 25% by weight.

If the content of the (meth)acrylate-based functional group including an aromatic functional group in the (meth)acrylate-based resin is too low, the effect of increasing the compatibility with the epoxy resin or the phenol resin may be insignificant, and the effect of lowering the hygroscopic property of the finally produced adhesive film is also insignificant, thereby making it difficult to obtain the effect expected from the composition of the embodiment.

If the content of the (meth)acrylate-based functional group including an aromatic functional group in the (meth)acrylate-based resin is too high, the adhesive strength of the finally produced adhesive film can be lowered.

The aromatic functional group may be an aryl group having 6 to 20 carbon atoms; or an arylalkylene group including an aryl group having 6 to 20 carbon atoms and an alkylene group having 1 to 10 carbon atoms.

The (meth)acrylate-based repeating unit containing an epoxy-based functional group may include a cycloalkylmethyl(meth)acrylate repeating unit having 3 to 20 epoxy carbon atoms. The "cycloalkylmethyl having 3 to 20 epoxy carbon atoms" refers to a structure in which a cycloalkyl having 3 to 30 carbon atoms to which an epoxy group is bonded is substituted with a methyl group.

Examples of the cycloalkylmethyl(meth)acrylate having 3 to 20 epoxy carbon atoms include glycidyl(meth)acrylate and 3,4-epoxycyclohexylmethyl(meth)acrylate.

Meanwhile, the (meth)acrylate-based resin may further include at least one repeating unit selected from the group consisting of a vinyl-based repeating unit containing a reactive functional group and a (meth)acrylate-based functional group containing an alkyl group having 1 to 10 carbon atoms.

The reactive functional group may include at least one functional group selected from the group consisting of alcohols, amines, carboxylic acids, epoxides, imides, (meth)acrylates, nitriles, norbornenes, olefins, polyethylene glycols, thiols, and vinyl groups.

When the (meth)acrylate-based resin further includes at least one repeating unit selected from the group consisting of a vinyl-based repeating unit containing a reactive functional group and a (meth)acrylate-based functional group containing an alkyl group having 1 to 10 carbon atoms, the (meth)acrylate-based resin may contain 0.1 to 20% by weight, or 0.5 to 10% by weight, of the (meth)acrylate-based repeating unit containing the epoxy-based functional group.

Meanwhile, in the adhesive layer of the embodiment, the weight ratio of the (meth)acrylate-based resin relative to the total weight of the (meth)acrylate-based resin, the epoxy resin, and the phenol resin may be 0.55 to 0.95.

As the adhesive layer includes the (meth)acrylate-based resin relative to the total weight of the (meth)acrylate-based resin, the epoxy resin, and the phenol resin within the above-mentioned range, the adhesive layer exhibits low elongation while exhibiting a relatively high modulus at the initial elongation, and thus can realize a high cutting property in the expanding process at a low temperature and at the same time realize high elasticity, excellent mechanical properties, and high adhesive strength.

If the weight ratio of the (meth)acrylate-based resin relative to the total weight of the (meth)acrylate-based resin, the epoxy resin, and the phenol resin is lower than the above-mentioned range, the adhesive properties of the adhesive layer are lowered and thus the wettability of wafers is reduced, which makes it impossible to expect a uniform cutting property, and from the viewpoint of reliability, adhesion between the wafer and the adhesive film interface is lowered, which leads to a decrease in the adhesive strength and makes the reliability vulnerable.

If the weight ratio of the (meth)acrylate-based resin relative to the total weight of the (meth)acrylate-based resin, the epoxy resin, and the phenol resin is higher than the above-mentioned range, the modulus generated when the adhesive layer is elongated by 5% to 15% at room temperature may not be sufficient and may become significantly high, and the elongation of the adhesive layer at room temperature may be greatly increased while the cutting property becomes low, thereby greatly inhibiting workability.

The weight ratio of the epoxy resin and the phenol resin in the adhesive layer can be adjusted in consideration of the properties of the finally produced product, and for example, the weight ratio may be 10:1 to 1:10.

Meanwhile, the curing agent contained in the adhesive layer may include a phenol resin, and more specifically, it may include a phenol resin having a softening point of 100° C. or more.

The phenol resin may have a softening point of 100° C. or more, 110° C. to 160° C., or 115° C. to 150° C.

The adhesive layer of the above embodiment may include a phenol resin having a relatively high softening point, and the phenol resin having a softening point of 100° C. or more, 110° C. to 160° C., or 115° C. to 150° C. as described above may form a base (or matrix) of the adhesive component together with the liquid epoxy resin and the thermoplastic resin having a glass transition temperature of −10° C. to 30° C., and allows the adhesive film produced from the adhesive layer to have a higher tensile modulus and excellent adhesive strength at room temperature and to have flow properties that are optimized for a semiconductor.

On the contrary, if the softening point of the phenol resin is less than the above-mentioned range, the tensile modulus of the adhesive film produced from the adhesive layer may be lowered or elongation at room temperature may be significantly increased, and the melt viscosity of the adhesive film may be decreased or the modulus may be lowered, and thus more burrs may be generated by heat generated in a dicing process or the cutting property or pickup efficiency may be lowered.

Further, in the process of bonding the adhesive film or when the adhesive film is exposed to a high temperature condition for a long time, a large amount of bleed-out may be generated.

Further, the phenol resin may have a hydroxyl equivalent weight of 80 g/eq to 400 g/eq, a hydroxyl equivalent weight of 90 g/eq to 250 g/eq, a hydroxyl equivalent weight of 100 g/eq to 178 g/eq, or a hydroxyl equivalent weight of 210 g/eq to 240 g/eq. As the phenol resin has the above-mentioned hydroxyl equivalent weight range, the curing degree may be increased even with a short curing time, and thereby the adhesive layer can afford a higher tensile modulus and excellent adhesive strength at room temperature.

The phenol resin may include at least one selected from the group consisting of a bisphenol A novolac resin and a biphenyl novolac resin.

Meanwhile, the epoxy resin may serve to adjust the curing degree of the adhesive layer or increase adhesive performance or the like.

Specific examples of the epoxy resin include at least one polymer resin selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenylmethane type of epoxy resin, an alkyl modified triphenylmethane type of epoxy resin, a naphthalene type of epoxy resin, a dicyclopentadiene type of epoxy resin, and a dicyclopentadiene modified phenol type of epoxy resin.

The softening point of the epoxy resin may be 50° C. to 120° C.

If the softening point of the epoxy resin is too low, the adhesive strength of the adhesive layer may increase and thus the pickup property of chips after dicing can be lowered. If the softening point of the epoxy resin is too high, flowability of the adhesive layer may be lowered, and the adhesive strength of the adhesive layer may be lowered. The epoxy resin may have an epoxy equivalent weight of 100 to 300 g/eq.

The curing agent may further include at least one compound selected from the group consisting of an amine-based curing agent and an acid anhydride-based curing agent.

The amount of the curing agent used may be appropriately selected in consideration of physical properties of the finally produced adhesive film, and the like, and for example, it may be used in an amount of 10 to 700 parts by weight, or 30 to 300 parts by weight, based on 100 parts by weight of the epoxy resin.

The adhesive layer may further include a curing catalyst.

The curing catalyst serves to facilitate the action of the curing agent or the curing of the adhesive layer, and any curing catalyst known to be used in the manufacture of an adhesive film for a semiconductor and the like may be used without particular limitation.

For example, as the curing catalyst, one or more kinds selected from the group consisting of a phosphorus compound, a boron compound, a phosphorous-boron compound, and an imidazole-based compound may be used. The amount of the curing catalyst used may be appropriately selected in consideration of physical properties of the finally produced adhesive film, and the like, and for example, it may be used in an amount of 0.5 to 10 parts by weight, based on 100 parts by weight of the total weight of the liquid and solid epoxy resin, the (meth)acrylate-based resin, and the phenol resin. The adhesive layer may further include an ion scavenger including: a metal oxide including one or more metals selected from the group consisting of zirconium, antimony, bismuth, magnesium, and aluminum; porous silicate; porous aluminosilicate; or zeolite.

Examples of the metal oxide including one or more metals selected from the group consisting of zirconium, antimony, bismuth, magnesium, and aluminum may include a zirconium oxide, an antimony oxide, a bismuth oxide, a magnesium oxide, an aluminum oxide, an antimony bismuth-based oxide, a zirconium bismuth-based oxide, a zirconium magnesium-based oxide, a magnesium aluminum-based oxide, an antimony magnesium-based oxide, an antimony aluminum-based oxide, an antimony zirconium-based oxide, a zirconium aluminum-based oxide, a bismuth magnesium-based oxide, a bismuth aluminum-based oxide, or a mixture of two or more kinds thereof.

The ion scavenger may serve to adsorb metal ions or halogen ions and the like existing inside the adhesive layer or the adhesive film produced therefrom, and thus may improve electrical reliability of the wires making contact with the adhesive film. The content of the ion scavenger in the adhesive layer is not particularly limited, but considering the reactivity with transition metal ions, workability, and the physical properties of the adhesive film manufactured from the resin composition, it may be contained in an amount of 0.01 to 20% by weight, preferably 0.01 to 10% by weight, based on the total solid weight of the adhesive composition for a semiconductor. The adhesive layer may further include 10% by weight to 90% by weight of an organic solvent. The content of the organic solvent may be determined in consideration of the physical properties of the adhesive layer, the physical properties of the finally produced adhesive film, and the manufacturing processes.

The adhesive layer may further include one or more additives selected from the group consisting of a coupling agent and an inorganic filler. Specific examples of the coupling agent and inorganic filler are not particularly limited, and components known to be usable in an adhesive for semiconductor packaging may be used without significant limitations.

Meanwhile, the adhesive layer may have a modulus of 100 MPa or more when being elongated up to 5% at a speed of 0.3 mm/s at room temperature.

Further, the adhesive layer may have a modulus of 55 MPa or more, generated when being elongated to 10% at a speed of 0.3 mm/s at room temperature, and may have a modulus of 40 MPa or more, generated at 15% elongation.

Further, the elongation of the adhesive layer at room temperature may be 300% or less.

The adhesive layer exhibits low elongation while exhibiting relatively high elasticity during initial elongation, and can realize a high cutting property in the expanding process at a low temperature, and at the same time realize high elasticity, excellent mechanical properties, and high adhesive strength.

Further, the adhesive layer is applied to a package having a multilayered structure of semiconductor chips to realize a more stable structure, mechanical properties such as excellent heat resistance and impact resistance, and also prevent reflow cracks and the like. In particular, even when exposed to a high temperature condition for a long time that is applied in a semiconductor manufacturing process, voids may not be substantially generated.

Further, the adhesive layer has high breaking strength and low elongation at break, and thus can be applied for non-contact-type adhesive cutting, for example, DBG (dicing before grinding), as well as wafer cutting using a knife blade, and has an excellent cutting property even at a low temperature, and thus, even if it is allowed to stand at room temperature after being cut, the possibility of re-adhesion becomes low, thus increasing reliability and efficiency in a semiconductor manufacturing process.

The adhesive film may be used as a die attach film (DAF) for attaching a lead frame or a substrate with a die or attaching a die with a die.

Thus, the adhesive film may be processed in the form of a die bonding film, a dicing die bonding film, or the like.

Meanwhile, in the adhesive film for a semiconductor, the adhesive film may have a thickness of 0.1 μm to 300 μm.

Also, the thickness of the conductive layer relative to the adhesive layer may be 0.001 to 0.8, or 0.002 to 0.5.

Since the thickness of the conductive layer relative to the adhesive film for a semiconductor is in the range of 0.001 to 0.8, or 0.002 to 0.5, the adhesive film can achieve high adhesive strength even while securing stable electromagnetic wave shielding efficiency.

The thickness of each of the conductive layer and the adhesive layer may be a thickness of one layer, a total thickness of one or more conductive layers, or a total thickness of one or more adhesive layers.

The adhesive film for a semiconductor may include at least one of each of the conductive layer and the adhesive layer.

For example, the adhesive film for a semiconductor may have a structure in which two adhesive layers are formed on both surfaces of the conductive layer, and the conductive layer and the adhesive layer may be sequentially laminated.

Meanwhile, according to another embodiment of the present invention, a semiconductor device including an adhesive film for a semiconductor, and a semiconductor element making contact with one surface of the adhesive layer of the adhesive film, can be provided.

As described above, the adhesive film for a semiconductor can improve the reliability of a semiconductor chip due to improved physical properties of the cured product, and can be applied to various cutting methods without specific limitations to realize and excellent cutting property, thus improving reliability and efficiency of a semiconductor packaging process, and additionally, the adhesive film for a semiconductor includes the conductive layer together, and thus exhibits excellent electromagnetic wave absorption performance.

The adhesive layer located at the outermost surface of the adhesive film can be bonded onto one surface of the semiconductor element.

Further, the other adhesive layer located at the other outermost surface of the adhesive film may be bonded to an adherend such as a substrate.

Specific examples of the adherend are not limited, and for example, the adherend may be a circuit board or a lead frame.

Specifically, as the circuit board, conventionally known substrates such as a printed wiring board can be used.

Further, as the lead frame, an organic substrate including a metal lead frame such as a Cu lead frame and a 42 Alloy lead frame, or a glass epoxy, BT (bismaleimide-triazine), polyimide, or the like can be used.

As described above, the adhesive film for a semiconductor may include at least one selected among the conductive layer and the adhesive layer.

For example, the adhesive film for a semiconductor may have a structure in which two adhesive layers are formed on both surfaces of the conductive layer, or it may have a structure in which the conductive layer and the adhesive layer are sequentially laminated.

Further, the semiconductor device may include one or more of the adhesive film for a semiconductor and the semiconductor element.

For example, the semiconductor device may have a structure in which one or more of the adhesive film for a semiconductor and the semiconductor element are sequentially laminated, respectively.

More specifically, the semiconductor device may further include an adherend for bonding with the semiconductor element through a wire bonding or a flip-chip method. The adhesive film for a semiconductor may be formed between the adherend and the semiconductor element, or the adhesive film may be formed on a surface opposite to a surface to which the semiconductor element and the adherend are bonded.

In addition, the semiconductor device may include two or more semiconductor elements, and at least two of the two or more semiconductor elements may be bonded via the adhesive film for a semiconductor.

Examples of the semiconductor device of this embodiment are as shown in FIGS. 1 to 3.

However, the details of the semiconductor device of the above embodiment are not limited thereto.

For example, as shown in FIG. 1, the semiconductor device is configured such that a circuit pattern 116 is formed on a package substrate 110, a signal pad 112 and a ground contact 114 may be disposed thereon, the signal pad or the ground contact can be bonded to a semiconductor element 120 via a bonding pad 122 and a conductive wire 125, and the adhesive film for a semiconductor described above may be formed between the semiconductor element and the circuit pattern or package substrate.

The semiconductor element may be buried in a molding member 130.

Further, as shown in FIG. 2, the semiconductor device may have a structure in which a first semiconductor element 201 and a second semiconductor element 202 are laminated on a package substrate 200, the first semiconductor element and the second semiconductor element are connected to a ground contact part 203 via a conductive wire 204, and a first adhesive film 210 for a semiconductor and a second adhesive film 220 for a semiconductor may be respectively formed between the package substrate and the first semiconductor element, and between the first semiconductor element and the second semiconductor element.

The first semiconductor element, the second semiconductor element, and the conductive wire may be buried in a molding member 205.

Further, as shown in FIG. 3, a first semiconductor element 301 can be bonded on a package substrate 300 through a wire bonding or flip-chip method, and a FOW (film over wire) 308 can be formed on the first semiconductor element. A second semiconductor element 302, a third semiconductor element 303, a fourth semiconductor element 304, and a fifth semiconductor element 305 are sequentially laminated on the FOW, and a first adhesive film 310 for a semiconductor, a second adhesive film 320 for a semiconductor, and a third adhesive film 330 for a semiconductor may be respectively formed between the second semiconductor element 302, the third semiconductor element 303, the fourth semiconductor element 304, and the fifth semiconductor element 305.

The second semiconductor element 302, the third semiconductor element 303, the fourth semiconductor element 304, and the fifth semiconductor element 305 can be connected to a ground contact part 306 through a conductive wire 307, respectively or simultaneously. All of these can also be buried in a molding member.

Advantageous Effects

According to the present invention, there may be provided an adhesive film for a semiconductor that can improve the reliability of a semiconductor chip due to improved physical properties of the cured product, and can be applied to various cutting methods without specific limitations to realize an excellent cutting property, thus improving reliability and efficiency of a semiconductor packaging process, and which can exhibit excellent electromagnetic wave absorption performance, and a semiconductor device including the above-mentioned adhesive film for the semiconductor.

BRIEF DESCRIPTION OF THE DRAWINGS

FIG. 1 shows an example of a semiconductor device including an adhesive film for a semiconductor according to one embodiment of the present invention.

FIG. 2 shows another example of a semiconductor device including an adhesive film for a semiconductor according to one embodiment of the present invention.

FIG. 3 shows still another example of a semiconductor device including an adhesive film for a semiconductor according to one embodiment of the present invention.

DETAILED DESCRIPTION OF THE EMBODIMENTS

Specific embodiments of the invention will be described in more detail by way of the following examples. However, these examples are only to illustrate specific embodiments of the invention, and the scope of the invention is not limited thereto.

Examples 1 to 5: Production of Adhesive Layer and Adhesive Film for Semiconductor Example 1

(1) Production of a Solution of an Adhesive Layer 57 g of phenol resin KH-6021 (produced by DIC Corp., bisphenol A novolac resin, hydroxyl equivalent weight: 121 g/eq, softening point: 125° C.), which is a curing agent for epoxy resin, 85 g of epoxy resin EOCN-104S (produced by Nippon Kayaku Co., Ltd., cresol novolac type of epoxy resin, epoxy equivalent weight: 214 g/eq, softening point: 83° C.), 425 g of the acrylate resin (KG-3015P), 61.7 g of R972, 0.96 g of DICY, and 0.11 g of 2MAOK were mixed in a methyl ethyl ketone solvent to obtain a solution for an adhesive layer (solid content: 20 wt % concentration).

(2) Production of Adhesive Film for Semiconductor

The above produced solution for an adhesive layer was coated onto a release-treated polyethylene terephthalate film (thickness 38 μm), and then dried at 110° C. for 3 min to obtain an adhesive film with a thickness of about 9 μm.

Then, the adhesive film was laminated on both surfaces of an about 2 μm thick copper foil to produce an adhesive film for a semiconductor with a thickness of about 20 μm.

Example 2

A solution for an adhesive layer (solid content: 20 wt % concentration) was obtained in the same manner as in Example 1, except that KG-3082 was used instead of KG-3015P for the acrylate resin. By using the resulting solution, the adhesive film was laminated on both surfaces of an about 2 μm thick copper foil in the same manner as in Example 1 to produce an adhesive film for a semiconductor with a thickness of about 20 μm.

Example 3

An about 0.05 μm thick niobium (Nb) oxide layer was formed on one surface of an about 2 μm thick copper foil by a sputtering deposition method.

Then, an adhesive film having a thickness of about 9 μm obtained in Example 1 was laminated on the niobium (Nb) oxide layer.

Similarly, an about 0.05 μm thick niobium (Nb) oxide layer was formed on the other surface of the about 2 μm thick copper foil by a sputtering deposition method, and the adhesive film having a thickness of about 9 μm was laminated.

Comparative Example 1

The solution for an adhesive layer produced in Example 1 was coated onto a release-treated polyethylene terephthalate film (thickness: 38 μm), and then dried at 110° C. for 3 min to obtain an adhesive film having a thickness of 20 μm.

Comparative Example 2

The 0.04 μm thick copper layer was formed on the adhesive film having a thickness of about 9 μm obtained in Example 1, and the adhesive film having a thickness of about 9 μm was laminated again on the copper layer to produce an adhesive film for a semiconductor having a thickness of about 18.4 μm.

TABLE 2

Composition of resin compositions of examples [unit: g]

|  |  | Example 1 | Example 2 |
|---|---|---|---|
| Curing agent | KH-6021 | 57 | 57 |
| Epoxy resin | EOCN-104S | 85 | 85 |
| Filler | R972 | 61.7 | 61.7 |
| Acrylate resin | KG-3015P | 425 |  |
|  | KG-3082 |  | 425 |
| Curing catalyst | DICY | 0.96 | 0.96 |
|  | 2MAOK | 0.11 | 0.11 |

KH-6021: Bisphenol A novolac resin (DIC Corp., softening point: about 125° C., hydroxyl equivalent weight: 118 g/eq)

EOCN-104S: Cresol novolac epoxy (Nippon Kayaku Co., Ltd., epoxy equivalent weight: 180 g/eq, softening point: 90° C.)

<Filler>
R 972: Evonik Industries, fumed silica, average particle size 17 nm

<Acrylate Resin>
KG-3015P: Acrylic resin synthesized at a composition ratio of butyl acrylate:ethyl acrylate:acrylonitrile:methyl methacrylate:glycidyl methacrylate=41:24:30:2:3 (weight average molecular weight: about 900,000, glass transition temperature: 17° C.)

KG-3082: Acrylic resin synthesized at a composition ratio of butyl acrylate:acrylonitrile:glycidyl methacrylate:benzyl methacrylate=46:20:6:28 (weight average molecular weight: about 660,000, glass transition temperature: 14° C., hydroxyl equivalent weight: about 0.05 eq/kg)

<Additive>
DICY: Dicyandiamide
2 MAOK: Imidazole-based hardening accelerator 3

Experimental Examples: Evaluation of Electromagnetic Wave Shielding Effect of Adhesive Film for Semiconductor (1) Manufacture of Semiconductor Device The adhesion films for semiconductors respectively obtained in the examples and comparative examples were attached to a first semiconductor element having a quadrangular shape having one side of 10 mm and a thickness of 80 μm under the condition of a temperature of 70° C. The first semiconductor element to which the adhesive film was attached was attached to a BGA substrate under conditions of a temperature of 125° C., a pressure of 1 kg, and a time of 1 s.

Then, the BGA substrate to which the first semiconductor element was bonded was heat-treated at 125° C. for 1 h with a dryer to thermally cure the adhesive film.

Subsequently, wire bonding was carried out on the first semiconductor element at a wire diameter 23 μm and a pitch of 100 μm using a wire bonder (Manufacturer: ShinKawa, product name: UTC-1000) under the following conditions at 150° C.

(2) Evaluation of Electromagnetic Wave Shielding Effect

Electric power was applied to the above-produced semiconductor device through a signal source, a near field antenna was positioned on the semiconductor device, and then the intensity (dBm) of the electromagnetic wave obtained from the antenna was measured with 2D scanning using a spectrum analyzer in the range of frequencies of about 1 MHz to 8 GHz.

The measurement results are shown in Table 3 below.

TABLE 3

| Category | Conductive layer/ barrier layer | Shielding Efficiency (maximum dBm = 10log (mW)) | | | |
|---|---|---|---|---|---|
|  |  | 10 MHz | 10 MHz | 10 MHz | 10 MHz |
| Example 1 | Cu 2 μm | −115 | −114 | −110 | −118 |
| Example 2 | Cu 2 μm | −115 | −114 | −110 | −118 |
| Example 3 | Cu 2 μm/0.05 μm niobium (Nb) oxide layer*2 | −115 | −114 | −110 | −118 |
| Comparative Example 1 | None | −106 | −103 | −96 | −112 |
| Comparative Example 2 | Cu 0.04 μm | −103 | −103 | −97 | −114 |

The adhesive film of the examples exhibited a high modulus at the initial elongation, but a modulus was relatively lowered as the elongation rate increased. As the adhesive film had a low elongation rate at room temperature, it could achieve a high cutting property in the expanding process at low temperatures. It was also confirmed that excellent electromagnetic wave absorption performance could be realized as shown in Table 3 above.

In particular, in the case of the adhesive film of Example 2, as it had a higher modulus at the initial elongation and a lower elongation rate at room temperature as compared with Example 1, improved cutting properties could be realized in the expanding process at a low temperature.

More specifically, as shown in Table 3 above, it was confirmed that the adhesive film for a semiconductor of Examples 1 to 3 was configured such that a 2 μm thick copper layer was located between the adhesive layers, and thus it improved electromagnetic wave shielding performance by about 6 to 14 dBm in the frequency band of 1 MHz to 8 GHz compared with the comparative examples.

On the contrary, the adhesive film for a semiconductor of Comparative Example 2 having a structure in which a 0.04 μm thick copper layer was located between the adhesive layers was confirmed to have no remarkable difference in electromagnetic wave shielding performance in the frequency band of 1 MHz to 8 GHz compared with the comparative examples. Consequently, it could be seen that in order to improve the electromagnetic wave shielding performance, a conductive layer having a thickness of not less than a predetermined value was required.

Accordingly, it was confirmed that the adhesive films for semiconductors of Examples 1 to 3 could realize the characteristics that can effectively shield and absorb electromagnetic waves which cause malfunction of the electric element and adversely affect the human body.

(3) Evaluation of Ion Migration

The adhesive films for semiconductors of Examples 1 and 3 were laminated on two copper electrodes provided at intervals of 75 μm, and then heat-treated at 125° C. for 1 h in this state to thermally cure the adhesive film.

Subsequently, a voltage of 5.5 V was applied to the copper electrode under the conditions of 85° C. and 85 RH %, and the time required until the electrical resistance value suddenly decreased in a short time equal to a few minutes (occurrence of a short) was measured.

As a result of the time measurement, it was confirmed that the adhesive film for a semiconductor of Example 1 took 190 h to have a short occur, and that the adhesive film for a semiconductor of Example 3 took 220 hours to have a short occur. Thus, it was confirmed that with the adhesive films of the examples, it was relatively difficult to diffuse atoms or ions of the conductive layer into the adhesive layer owing to the characteristics of the adhesive layer. In particular, the adhesive film for a semiconductor of Example 2 could prevent the diffusion of atoms or ions into the adhesive layer due to the presence of a niobium oxide layer formed on both surfaces of the copper foil layer, and could improve the ionization of the metal of the conductive layer.

EXPLANATION OF SYMBOLS

110: package substrate
112: signal pad
114: ground contact
116: circuit pattern
120: semiconductor element
122: bonding pad
125: conductive wire
130: molding member
140: adhesive film for semiconductor
200: package substrate
201: first semiconductor element
202: second semiconductor element
203: ground contact part
204: conductive wire
205: molding member
210: first adhesive film for semiconductor
220: second adhesive film for semiconductor
300: package substrate
301: first semiconductor element
302: second semiconductor element
303: third semiconductor element
304: fourth semiconductor element
305: fifth semiconductor element
306: ground contact part
307: conductive wire
308: FOW (film over wire)
310: first adhesive film for semiconductor
320: second adhesive film for semiconductor
330: third adhesive film for semiconductor

The invention claimed is:

1. An adhesive film for a semiconductor comprising:
a conductive layer containing at least one metal selected from the group consisting of copper, nickel, cobalt, iron, stainless steel (SUS), and aluminum, and having a thickness of 0.05 μm to 10 μm; and
an adhesive layer formed on at least one surface of the conductive layer and including a (meth)acrylate-based resin, a curing agent, and an epoxy resin;
wherein the adhesive film has a thickness of 0.1 μm to 300 μm,
wherein a thickness ratio of the conductive layer relative to the adhesive layer is 0.001 to 0.8,
wherein the (meth)acrylatebased resin includes a (meth)acrylate-based repeating unit containing an epoxy-based functional group, and has a hydroxyl equivalent weight of 0.15 eq/kg or less, and
wherein the curing agent includes a phenol resin.

2. The adhesive film for a semiconductor of claim 1, wherein the conductive layer is a copper layer of 0.1 μm to 10 μm, a stainless steel (SUS) layer of 0.1 μm to 10 μm, an aluminum layer of 0.1 μm to 10 μm, a nickel layer of 0.1 μm to 10 μm, a cobalt layer of 0.1 μm to 10 μm, or an iron (Fe) layer of 0.1 μm to 10 μm.

3. The adhesive film for a semiconductor of claim 1, further comprising a barrier layer formed between the conductive layer and the adhesive layer and having a thickness of 0.001 μm to 1 μm.

4. The adhesive film for a semiconductor of claim 3, wherein the barrier layer includes at least one selected from the group consisting of titanium (Ti), zirconium (Zr), hafnium (Hf), vanadium (V), niobium (Nb), tantalum (Ta), stainless steel, a nickel alloy, and a rare earth metal, or oxides thereof, and nitrides thereof.

5. The adhesive film for a semiconductor of claim 1, wherein the (meth)acrylate-based resin further includes 2 to 40% by weight of the (meth)acrylate-based functional group containing an aromatic functional group.

6. The adhesive film for a semiconductor of claim 1, wherein a weight ratio of the (meth)acrylate-based resin relative to the total weight of the (meth)acrylate-based resin, the epoxy resin, and the phenol resin is 0.55 to 0.95.

7. The adhesive film for a semiconductor of claim 1, wherein the phenol resin has a softening point of 100° C. or more.

8. The adhesive film for a semiconductor of claim 1, wherein the epoxy resin has a softening point of 50° C. to 120° C.

9. A semiconductor device comprising the adhesive film for a semiconductor of claim 1, and a semiconductor element that is in contact with a surface of an adhesive layer of the adhesive film.

10. The semiconductor device of claim 9, wherein the semiconductor device further includes an adherent for bonding with the semiconductor element through a wire bonding or flip-chip method.

11. The semiconductor device of claim 10, wherein the adhesive film for a semiconductor is formed between the adherend and the semiconductor element, or
the adhesive film for a semiconductor is formed on a surface opposite to a surface to which the semiconductor element and the adherend are bonded.

12. The semiconductor device of claim 9, wherein the semiconductor device includes two or more semiconductor elements, and at least two of the semiconductor elements are bonded via the adhesive film for a semiconductor.

13. The adhesive film for a semiconductor of claim 4, wherein the nickel alloy includes an alloy containing nickel and one or more elements selected from the group consisting of carbon, manganese, silicon, sulfur, iron, copper, chromium, aluminum, titanium, molybdenum, and cobalt.

14. The adhesive film for a semiconductor of claim 1, wherein the (meth)acrylate-based resin has a glass transition temperature of 10° C. to 20° C.

* * * * *